FREQUENCY MODULATED CRYSTAL OSCILLATOR INCLUDING VOLTAGE VARIABLE CAPACITOR

Filed Oct. 30, 1967

INVENTORS
THEODORE N. TAHMISIAN JR.
DANIEL J. MAHONEY &
CHARLES N. LYNK JR.
BY Mueller, Aichele & Rauner
ATTYS.

3,528,032

FREQUENCY MODULATED CRYSTAL OSCILLATOR INCLUDING VOLTAGE VARIABLE CAPACITOR

Theodore N. Tahmisian, Jr., Oak Lawn, Daniel J. Mahoney, Elgin, and Charles N. Lynk, Elmwood Park, Ill., assignors to Motorola, Inc., Franklin Park, Ill., a corporation of Illinois Filed Oct. 30, 1967, Ser. No. 679,040
Int. Cl. H03c 3/22
U.S. Cl. 331—116 8 Claims

ABSTRACT OF THE DISCLOSURE

Frequency modulated crystal oscillator formed by Colpitts type circuit with transistor as active element and crystal operated in anti-resonant mode in series with voltage variable capacitor. The crystal and capacitor are connected across the capacitors of the Colpitts circuit. An inductor and a capacitor are connected in series with each other across the voltage variable capacitor to form therewith a network having a capacitive reactance which cooperates with the inductance of the crystal. The inductor acts to provide linear modulation characteristics, increases the modulation sensitivity, and is adjustable to warp the crystal frequency, and the capacitor in series therewith receives the modulating voltage which controls the voltage variable capacitor.

BACKGROUND OF THE INVENTION

Various attempts have been made to provide direct frequency modulation of a crystal oscillator for use in a frequency modulation transmitter. Crystal control of the oscillator is utilized to maintain the required precise frequency control of the transmitter, and such crystal control makes it difficult to vary the oscillator frequency sufficiently to provide the deviation required of the transmitted wave. Further, circuits which are effective to provide substantial deviation of the frequency of the crystal controlled oscillator tend to be complex and critical. The deviation in frequency does not vary linearly with the modulating voltage and the oscillator is unstable and basically unsuited to the requirements of a frequency modulation transmitter.

SUMMARY OF THE INVENTION

An object of the present invention is to provide a frequency modulated crystal controlled oscillator formed by a simple and inexpensive circuit.

Another object of the invention is to provide a solid state frequency modulated crystal oscillator including a voltage variable capacitor as the frequency varying device and which provides a frequency deviation varying substantially linearly with the modulating voltage.

A further object is to provide a directly modulated crystal oscillator wherein adequate frequency deviation and relatively stable operation over a range of temperature and voltage variations are obtained.

The oscillator circuit of the invention includes a transistor connected in a Colpitts type circuit with a crystal and a voltage variable capacitor connected in series with each other across the capacitors of the circuit. The crystal is operated in an anti-resonant mode wherein it presents an effective inductance, and an inductor and a further capacitor are connected in series across the voltage variable capacitor to form a network having an equivalent capacitive reactance. Modulating signals are applied across the further capacitor to change the capacitance of the voltage variable capacitor and thereby modulate the frequency of the oscillator. The coil acts to increase the modulation sensitivity, decreases the effective capacitance provided by the voltage variable capacitor to provide linear modulation characteristics, and may be adjustable to provide a warping action to adjust the center frequency. The crystal can be constructed to have a low inductance and to have a significant variation in frequency with change in capacity of the circuit. The transistor is biased for class C operation and has an output circuit tuned to a harmonic of the crystal frequency so that a relatively high output frequence is obtained by an extremely simple circuit.

DETAILED DESCRIPTION OF THE PREFERRED EMBODIMENT

Figure 1:
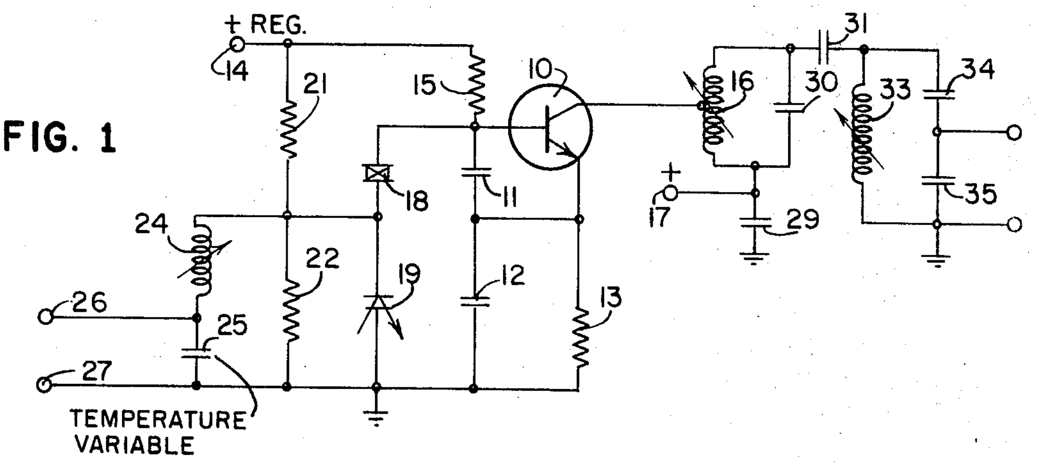
FIG. 1 is a circuit diagram of the frequency modulated crystal oscillator of the invention.

The circuit of the invention includes a transistor 10 connected in a Colpitts oscillator circuit including capacitor 11 connected between the base and emitter electrodes of the transistor and capacitor 12 connected between the emitter electrode and the reference potential. Resistor 13 connected to the emitter provides a signal which is fed back to the base electrode to cause oscillations. Capacitors 11 and 12 are relatively large in value to provide improved modulation sensitivity. A positive bias potential is applied from terminal 14 through resistor 15 to the base electrode of transistor 10. Bias is applied to the collector electrode from terminal 17 through a portion of inductor 16. The bias potentials are selected to cause class C operation of the transistor. Terminals 14 and 17 can be energized from the same supply, but it is important that the potential at terminal 14 be regulated The frequency determining circuit of the oscillator includes a piezoelectric crystal 18 connected in series with a voltage variable capacitor 19 across the capacitors 11 and 12. The crystal 18 is operated in an anti-resonant or parallel resonant mode so that it presents an effective inductance. The crystal 18 is selected to have a low inductance and a series resonant frequency relatively widely spaced from its anti-resonant frequency so that a relatively large change in frequency is possible to obtain relatively large deviation of the oscillator frequency.

A steady state bias voltage is applied to the voltage variable capacitor 19 from the regulated potential at terminal 14 by the voltage divider including resistors 21 and 22. Inductor 24 and capacitor 25 are connected in series with each other across the voltage variable capacitor 19. Modulating signals are applied across capacitor 25 from terminals 26 and 27. Terminal 27 is connected to the ground reference potential so that the modulating signal can be applied with respect to ground. The modulating voltage across capacitor 25 is applied through inductor 24 to the voltage variable capacitor 19 to change the capacitive reactance thereof.

Voltage variable capacitor 19 in combination with the coil 24 and capacitor 25 form an equivalent capacitive reactance $C_{eq}$ which is measured by the formula:

$$C_{eq}=C_{19}-\frac{1}{W^2L_{24}-1/C_{25}}$$

where $C_{19}$ is the value of capacitor 19, $L_{24}$ is the inductance of inductance of inductor 24, $C_{25}$ is the value of capacitor 25, and W is $2\pi f$, where $f$ is the crystal operating frequency. This equivalent capacitance cooperates with the values of capacitors 11 and 12 to form a resonant circuit with crystal 18 at the parallel resonant frequency of the crystal. The change in capacity of the voltage variable capacitor 19 produces a change in the equivalent capacitance which is applied to the crystal to change its frequency. The crystal may be designed to work with a capacitance of 32 picofarads, and a change in the equivalent capacitance will change this value to change the frequency of oscillation of the crystal according to a hyperbolic relationship.

It is apparent from the above formula that inductor 24 produces a change in the equivalent capacitance $C_{eq}$ with either a change in its inductance or a change in the operating frequency. The frequency, however, changes only slightly over the operating range. The inductor 24 can be made adjustable to warp the crystal frequency so that the center frequency of the oscillator is at the desired frequency.

The crystal 18 and the voltage variable capacitor 19 both contribute to non-linear modulation characteristics. The value of the voltage variable capacitor 19 and inductor 24 are selected in combination with the hyperbolic characteristic of the crystal to give the proper proportionality at a given frequency to minimize distortion. The value of a graded or abrupt junction type voltage variable capacitor 19 required for linear modulation characteristics is always greater than the correlation capacity of the crystal. Since modulation sensitivity increases as the value of $C_{eq}$ approaches the correlation capacity of the crystal, inductor 24 and capacitor 25 are connected in series with each other across the voltage variable capacitor 19 to reduce the equivalent capacitance $C_{eq}$ to a value close to the correlation capacity of the crystal. The use of a capacitor 19 having a larger value has the advantage that a larger change in value is produced with modulation as the change in the equivalent capacity is essentially the same as the change in value of the voltage variable capacitor 19, this further increases the modulated sensitivity.

The circuit with the modulating signal applied across capacitor 25 has better stability than if the modulating voltage is applied directly across the voltage variable capacitor, and provides good modulation sensitivity. Capacitor 25 provides a direct current block to the bias applied to capacitor 19, and can be selected with a temperature coefficient to compensate the oscillator for temperature variations.

Inductor 16 connected to the collector of transistor 10 is part of a double tuned output circuit including capacitor 30, coupling capacitor 31, inductor 33 and capacitors 34 and 35. Capacitor 29 connects the inductor 16 to ground at signal frequencies. This output circuit can be tuned to a harmonic of the crystal frequency. As the transistor 10 is operated class C, the signal at the collector has a large harmonic content. Accordingly, an output at a multiple of the crystal frequency, such as three times the crystal frequency, will be present and can be derived from the double tuned circuit. Capacitors 34 and 35 provide impedance matching so that a desired output impedance is provided, and capacitor 35 has one terminal grounded so that the output is derived with respect to ground.

Figure 2:
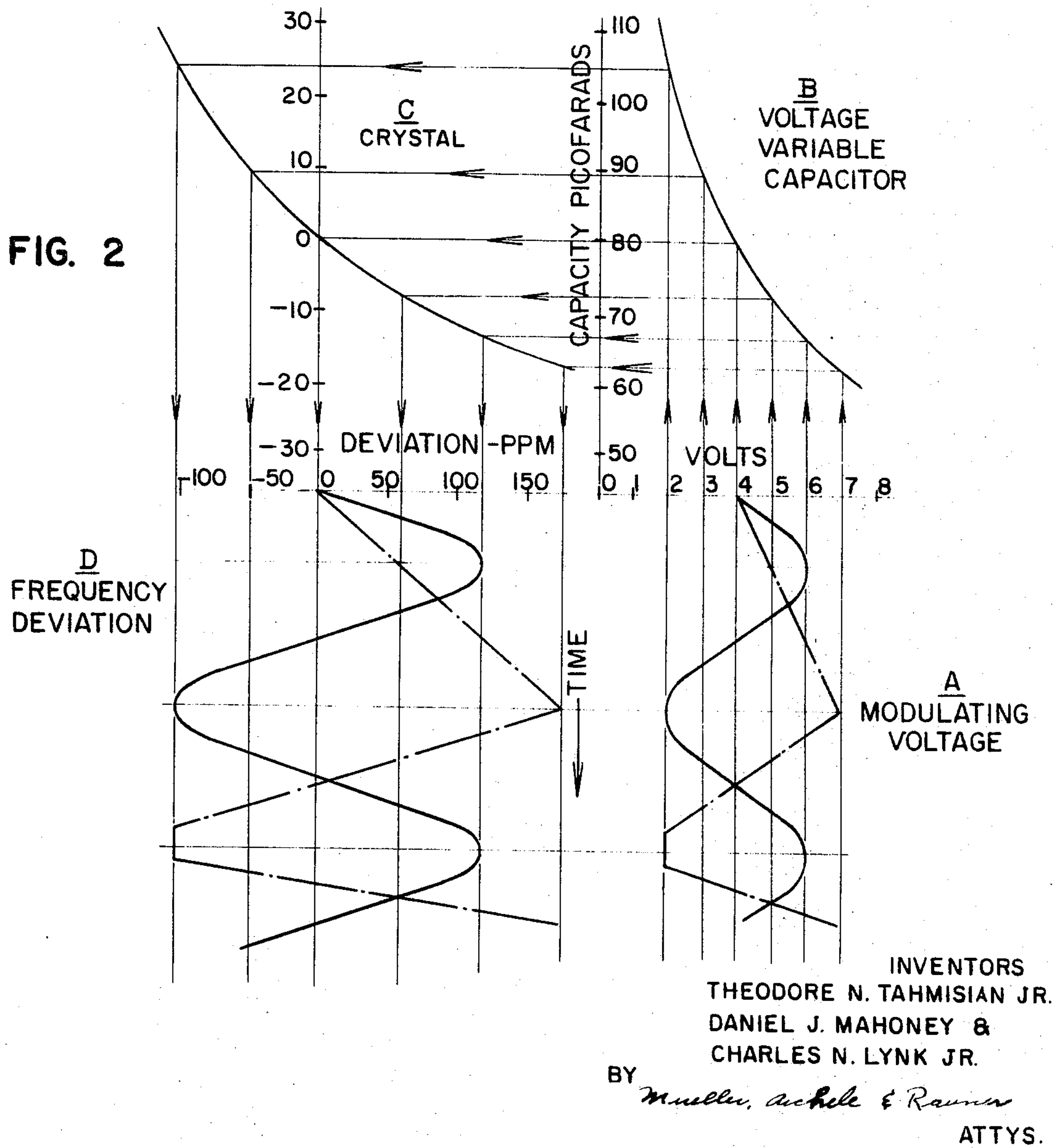
FIG. 2 is a chart illustrating the operation of the circuit of FIG. 1.

FIG. 2 illustrates the operation of the oscillator of the invention. Section A of FIG. 2 illustrates the modulating voltage applied to terminals 26 and 27, with the solid line curve representing a symmetrical sinusoidal voltage wave, and the dot-dash curve representing a non-symmetrical, non-sinusoidal modulating voltage. In both cases the modulating voltage has continuous dynamic variations. Curve B shows the variation in capacity produced by the voltage variable capacitor 19 in response to the modulating voltage applied thereto. It is seen that the capacity varies from a center value of 80 picofarads for a reverse bias of 4 volts to a little more than 100 picofarads for a bias of 2 volts, and to about 60 picofarads for a reverse bias of 8 volts. As previously described, the capacity of the varactor together with the values of capacitor 25 and inductor 24 form an equivalent capacitance which is in series with the crystal 18. The equivalent capacitance is less than the capacity of the varactor itself.

Curve C in FIG. 2 shows the variation in resonant frequency of the crystal with the variation in the equivalent capacitance coupled thereto. Curve C as shown applies when the equivalent capacitance is of the order of 40 picofarads. This capacitance, as stated above, is less than the capacitance of the varactor alone, but the change in capacitance is essentially the same as that of the varactor 19. The vertical scale for curve C is shown with respect to a center value which is 40 picofarads and is very close to the 32 picofarad correlation capacity capacity of crystal 18. Curve D shows the frequency deviation in parts per million (p.p.m.) produced by the change in frequency response of the crystal. It is apparent by comparing curves A and D that the frequency deviation varies with time in a substantially linear relation with the modulating voltage. This applies both for the solid curve wherein a symmetrical sinusoidal modulating voltage is applied and also for the dot-dash curve where a non-symmetrical, non-sinusoidal modulating voltage is applied.

In a circuit which has been found to be satisfactory for commercial use for operating with crystal frequencies from 12.5 to 15.0 megahertz, the components have the following values:

Transistor 10—NPN Motorola type 9494
Capacitor 11—270 picofarads
Capacitor 12—470 picofarads
Resistor 13—2.2 kilohms
Resistor 15—100 kilohms
Inductor 16—.2 to .5 microhenry
Crystal 18—correlation capacity 32 picofarads
Varactor 19—80 picofarads at 4.0 volts reverse bias
Resistor 21—470 kilohms
Resistor 22—470 kilohms
Inductor 24—2.4 to 6.1 microhenries
Capacitor 25—470 picofarads
Capacitor 29—.01 microfarad
Capacitor 30—120 picofarads
Capacitor 31—1.5 picofarads
Inductor 33—.2 to .5 microhenry
Capacitor 34—150 picofarads
Capacitor 35—330 picofarads The directly modulated crystal oscillator circuit described is quite simple and requires only a single inductor which serves a number of functions. By applying the modulating signal to the voltage variable capacitor across a capacitor which is connected in series with the inductor, a simple audio circuit is provided which has good stability and sensitivity. The inductor decreases the equivalent capacity in series with the crystal to thereby increase the modulation sensitivity, and also can be adjustable to warp the crystal frequency. The capacitor across which the audio is applied can also be used for temperature compensation.

Inasmuch as the transistor of the oscillator operates class C, it is possible to derive a harmonic frequency therefrom, and the harmonic frequency derived by the filter connected to the collector electrode may be selected to form the operating frequency of a transmitter. Therefore, the simple circuit provides crystal controlled operation, direct frequency modulation, and multiplication of the frequency.

We claim:

1. In a frequency modulated crystal controlled oscillator which includes an electron device for providing amplification to sustain oscillations and a frequency determining circuit connected to said electron device for controlling the frequency of oscillations, the frequency determining circuit including in combination, a piezoelectric element resonant at a frequency dependent upon the capacitance connected in series therewith, a voltage variable capacitor connected in series with said piezoelectric element, variable inductor means and capacitor means connected in series with each other across said voltage variable capacitor and forming therewith a network providing an equivalent capacitance having a value less than the capacitance of said voltage variable capacitor alone, said piezoelectric element operating in an antiresonant mode and forming an inductive reactance in series with the equivalent capacitance of said network, and means applying a modulating voltage having continuous dynamic variations across said capacitor means and through said inductor means to said voltage variable capacitor to change the capacitive reactance thereof and the equivalent capacitance of said network to thereby change the frequency of operation of said piezoelectric element and modulate the frequency of oscillations, said variable inductor means being adjustable to set the center frequency of oscillation of the oscillator and having a value to improve the linearity of the modulation of the oscillator frequency with respect to the modulating voltage, said inductor means having a value related to that of said voltage variable capacitor such that said equivalent capacitance of said network has a significant capacitance value throughout the modulation frequency range.

2. The combination of claim 1 wherein said piezoelectric element is a quartz crystal constructed to have a low inductance and wherein the series resonant mode thereof is at a frequency spaced substantially from the antiresonant mode thereof.

3. A frequency modulated crystal controlled oscillator including in combination, an oscillator circuit of the Colpitts type having a semiconductor device with first, second and third electrodes, and first and second capacitors connected in series with each other and having terminals coupled to said electrodes, a piezoelectric quartz crystal having a given correlation capacitance, a voltage variable capacitor connected in series with said crystal across said first and second capacitors, a variable inductor and a third capacitor connected in series with each other across said voltage variable capacitor and forming therewith a network presenting a capacitive reactance which has a value less than the capacitive reactance of said voltage variable capacitor alone, said crystal operating in its antiresonant mode and forming an inductive reactance in series with said capacitive reactance, and means applying a modulating voltage having continuous dynamic variations across said third capacitor to change the capacitive reactance of said voltage variable capacitor and of said network and thereby modulate the frequency of the oscillator, said variable inductor being adjustable to set the center frequency of the oscillator and having a value to improve the linearity of the modulation of the oscillator frequency, said inductor having a value related to the value of said voltage variable capacitance such that said network has a significant capacitive reactance throughout the frequency range of the modulated wave, said network and said first and second frequency determining capacitors cooperating to present a capacitance to said crystal substantially the same as the given correlation capacitance thereof.

4. An oscillator in accordance with claim 3 wherein said third capacitor has a temperature coefficient selected to compensate the oscillator frequency for changes in temperature.

5. An oscillator in accordance with claim 3 wherein said semiconductor device is a transistor, and which includes means for biasing said transistor for class C operation.

6. An oscillator in accordance with claim 5 including an output circuit coupled to said transistor and tuned to a harmonic of the frequency of said crystal, and means for deriving oscillations from said output circuit at a harmonic frequency of said crystal.

7. An oscillator in accordance with claim 6 wherein said output circuit is a double tuned circuit and has a capacitor divider output for impedance matching.

8. An oscillator in accordance with claim 3 wherein said capacitive reactance of said network has a value of the order of 40 picofarads at the center frequency of the oscillator.

References Cited

UNITED STATES PATENTS

| | | | |
|---|---|---|---|
| 3,230,396 | 1/1966 | Boelke | 331—76 |
| 3,345,573 | 10/1967 | Eschbaugh | 331—76 |
| 3,382,462 | 5/1968 | Davis | 332—26 |
| 3,068,427 | 12/1962 | Weinberg | 332—26 |

FOREIGN PATENTS

| | | |
|---|---|---|
| 1,005,937 | 9/1965 | Great Britain. |

OTHER REFERENCES

Wireless World, Gray, "Frequency Stabilization of Oscillators," pp. 219, 220, May 1956.

D. E. Newell, Electronics, "Measuring Eyeball Pressure With a Crystal Oscillator," pp. 64, 65, Sept. 8, 1961.

JOHN KOMINSKI, Primary Examiner

U.S. Cl. X.R.

331—76, 177; 332—26